(12) United States Patent
Duryea

(10) Patent No.: US 8,189,309 B2
(45) Date of Patent: May 29, 2012

(54) CLAMP FOR CONTROLLING CURRENT DISCHARGE

(75) Inventor: Timothy P. Duryea, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 510 days.

(21) Appl. No.: 12/504,957

(22) Filed: Jul. 17, 2009

(65) Prior Publication Data

US 2011/0013328 A1    Jan. 20, 2011

(51) Int. Cl.
*H02H 9/00* (2006.01)
(52) U.S. Cl. ......................................................... 361/56
(58) Field of Classification Search .................... 361/56
See application file for complete search history.

(56) References Cited

U.S. PATENT DOCUMENTS

| | | | | |
|---|---|---|---|---|
| 4,581,542 | A | * | 4/1986 | Steigerwald ................. 327/440 |
| 4,695,770 | A | | 9/1987 | Raets |
| 5,001,373 | A | | 3/1991 | Bator et al. |
| 5,617,283 | A | * | 4/1997 | Krakauer et al. ............... 361/56 |
| 5,723,916 | A | | 3/1998 | Disney et al. |
| 5,764,088 | A | | 6/1998 | Lavieville et al. |
| 5,812,006 | A | | 9/1998 | Teggatz et al. |
| 5,920,224 | A | | 7/1999 | Preslar |
| 6,078,204 | A | | 6/2000 | Cooper et al. |
| 6,091,274 | A | | 7/2000 | Preslar |
| 6,327,126 | B1 | * | 12/2001 | Miller et al. .................... 361/56 |
| 6,580,321 | B1 | | 6/2003 | Arell et al. |
| 6,617,906 | B1 | | 9/2003 | Hastings |

OTHER PUBLICATIONS

"Protection Functions in Integrated Low Side Switches," Int. Semiconductor Conf. CAS, Sep. 2007, vol. 2, pp. 513-516 (Andrei Danchiv).

"Thermally Optimized Demagnetization of Inductive Loads," Proc. Euro Solid-State Circuits, Sep. 2004, pp. 243-246 (Wolfgang Horn and Peter Singerl).

"A New Soft Self-Clamping Scheme for Improving The Self-Clamped Inductive Switching (SCIS) Capability of Automotive Ignition IGBT," Int. Symp. Power Semiconductor Devices and ICs, Jeju, Korea, May 2007, pp. 145-148 (In-Hwan Ji, Kyu-Heon Cho, Seung-Chul Lee, Soo-Seong Kim, Kwang-Hoon Oh, Chong-Man Yun and Min-Koo Han).

"Design Aspects for Gate Driver of Power Switch," Int. Semiconductor Conf. CAS, vol. 2, Sep. 2007, pp. 505-508 (Cristian Ionascu).

"A Configurable High-Side/Low-Side Driver With Fast and Equalized Switching Delay," IEEE J. Solid-State Circuits, vol. 43, No. 7, Jul. 2008, pp. 1617-1625 (Michael Wendt, Lenz Thoma, Bernhard Wicht, and Doris Schmitt-Landsiedel).

"Driving and Protection of High Side NMOS Power Switches," IEEE Trans. Industry Applications, vol. 28, No. 1, pp. 26-30 (William C. Dunn), Jan. 1992.

(Continued)

*Primary Examiner* — Stephen W Jackson
(74) *Attorney, Agent, or Firm* — John J. Patti; Wade J. Brady, III; Frederick J. Telecky, Jr.

(57) ABSTRACT

In many applications, particularly in automotive applications, integrated circuits (IC) are designed to withstand large fly-back currents from inductive loads. As these ICs have become smaller, the switching transistors (which are coupled to the inductive loads) have remained relatively large so as to withstand the fly-back currents. The size of these switching transistors has become a limiting factor in designing compact ICs. Here, an IC is provided with an adaptive clamp that allows for a significant reduction in the area of a switching transistor for an inductive load.

20 Claims, 2 Drawing Sheets

OTHER PUBLICATIONS

"A 70mΩ Intelligent High Side Switch With Full Diagnostics," IEEE J. Solid-State Circuits, vol. 31, No. 7, Jul. 1996, pp. 915-923 (Roberto Gariboldi and Francesco Pulvirenti).

"Low-Side Power Output Drive Stage Design and Development Concerns," Proc. IEEE Bipolar/BiCMOS Circuits and Technology Meeting, 2000, pp. 74-81 (Reed W. Adams, John H. Carpenter Jr. and Tohru Tanaka).

"A Novel Active Feedback Flyback With Only 100-mV Inductive overshoot for a Standard Low-Voltage CMOS Inductive Load Driver, in a Single-Chip Controller for 73 Relays in a POTS/ADSL Splitter Application," IEEE J. Solid-State Circuits, vol. 40, No. 7, Jul. 2005, pp. 1541-1549 (Jan F.J. Wouters, Jan Sevenhans, Stefaan Van Hoogenbemt, Thierry Fernandez, Jeff Bridges, Carl Das, and Steven A.M. Dupont).

* cited by examiner

CLAMP FOR CONTROLLING CURRENT DISCHARGE

TECHNICAL FIELD

The invention relates generally to clamping circuits and, more particularly, to an active clamping circuit to discharge fly-back currents from an inductive load.

BACKGROUND

In cases where high supply voltage transients or spikes exist (such as automotive load-dump faults that be as larger as 40V), clamping voltages are sometimes forced to be above this level to avoid unintentional turn-on during such spikes. Referring to FIG. 1 of the drawings, the reference numeral 100 generally designates a conventional integrated circuit (IC) used in such an application. IC 100 generally includes a pin or terminal 108 that is generally coupled to an inductor L (such as a motor winding). For IC 100, when an actuation signal is provided through buffer 102 and resistor R1 to the control electrode or gate of transistor Q1 (which is generally an NMOS transistor), a circuit is completed between the voltage supply VCC and ground, energizing the inductor L. When transistor Q1 is deactuated, energy remains stored in inductor L, so as the magnetic field collapses, a fly-back current is generated in IC 100, which can damage transistor Q1.

To protect transistor Q1, a clamp is provided. The clamp generally comprises resistor R2 and diode stacks 104 and 106. The fly-back current traverses resistor R2 and the reversed biased zener diodes of stack 106, which reduces the voltage level of the fly-back current. This reduced voltage level of the fly-back current is further reduced by the forward bias diodes of stack 104, so that transistor Q1 can be actuated to discharge the energy stored in the inductor L. Once discharged, transistor Q1 is safely deactuated.

While this configuration does aptly discharge the inductor L, it does have limitations. Namely, for high reliability applications, such as automotive application, transistor Q1 must be very large (for example, 489,000 $\mu m^2$). These very large transistor dimensions have become a severe limiting factor in the design of more compact high reliability ICs.

Some examples of conventional circuits are: A. Danchiv, "Protection functions in integrated low side switches," *Int. Semiconductor Conf. CAS*, vol. 2, pp. 513-516, September 2007; W. Horn, and P. Singerl, "Thermally optimized demagnetization of inductive loads," *Proc. Euro. Solid-State Circuits*, pp. 243-246, September 2004; M. Han, "A new soft self-clamping scheme for improving the self-clamped inductive switching (SCIS) capability of automotive ignition IGBT," *Int. Symp. Power Semiconductor Devices and ICs*, pp. 145-148, May 2007; C. Ionascu, "Design aspects for gate driver of power switch," *Int. Semiconductor Conf. CAS*, vol. 2, pp. 505-508, September 2007; M. Wendt, L. Thoma, B. Wicht, and D. Schmitt-Landsiedel, "A configurable highside/low-side driver with fast and equalized switching delay," *IEEE J. Solid-State Circuits*, vol. 43, no. 7, pp. 1617-1625, July 2008; W. C. Dunn, "Driving and protection of high side NMOS power switches," *IEEE Trans. Industry Applications*, vol. 28, no. 1, pp. 26-30, January 1992; R. Gariboldi and F. Pulvirenti, "A 70 m intelligent high side switch with full diagnostics," *IEEE J. Solid-State Circuits*, vol. 31, no. 7, pp. 915-923, July 1996; R. W. Adams, J. H. Carpenter, and T. Tanaka, "Low-side power output drive stage design and development concern," *Proc. IEEE Bipolar/BiCMOS Circuits and Technology Meeting*, pp. 74-81, 2000; J. Wouters, J. Sevenhans, S. Hoogenbemt, T. Fernandez, J. Biggs, C. Das, and S. Dupont, "A novel active feedback flyback with only 100 mV inductive overshoot for a standard low-voltage CMOS inductive load driver, in a single-chip controller for 73 relays in a POTS/ADSL splitter application," *IEEE J. Solid-State Circuits*, Vol. 40, No. 7, pp 1541-1549, July 2005; U.S. Pat. Nos. 4,695,770; 5,001,373; 5,723,916; 5,764,088; 5,812,006; 5,920,224; 6,078,204; 6,091,274; 6,580,321; 6,617,906.

SUMMARY

A preferred embodiment of the present invention, accordingly, provides an apparatus. The apparatus comprises a first terminal; a second terminal; a first transistor having a first passive electrode, a second passive electrode, and a control electrode, wherein the first passive electrode of the first transistor is coupled to the second terminal; a first resistive element that is coupled to the second terminal; a first diode stack that is coupled to the first resistive element, wherein the first diode stack has a first breakdown voltage; a second diode stack that is coupled between the first diode stack and the control electrode of the first transistor, wherein the second diode stack has a second breakdown voltage; a second resistive element that is coupled between the first terminal and a node between the first and second diode stacks; and a second transistor having a first passive electrode, a second passive electrode, and a control electrode, wherein the first passive electrode of the second transistor is coupled to the node between the first and second diode stacks, and wherein the control electrode of the second transistor is coupled to the first terminal, and wherein the second passive electrode of the second transistor is coupled to the control electrode of the first transistor.

In accordance with a preferred embodiment of the present invention, the first and second diode stacks further comprise a first and a second set of zener diodes, respectively.

In accordance with a preferred embodiment of the present invention, the apparatus further comprises a diode that is coupled between the second resistive element and the first terminal.

In accordance with a preferred embodiment of the present invention, the apparatus further comprises a diode that is coupled substantially in parallel to the second resistive element.

In accordance with a preferred embodiment of the present invention, the apparatus further comprises: a buffer; and a third resistive element that is coupled between the buffer and the control electrode of the first transistor.

In accordance with a preferred embodiment of the present invention, the first and second resistive elements further comprise a first resistor and a second resistor, respectively.

In accordance with a preferred embodiment of the present invention, an apparatus is provided. The apparatus comprises a voltage supply; an inductor that is coupled to the voltage supply; and an integrated circuit (IC) having: a first terminal that is coupled to the inductor and the voltage supply; a second terminal that is coupled to the inductor; a first transistor having a first passive electrode, a second passive electrode, and a control electrode, wherein the first passive electrode of the first transistor is coupled to the second terminal, and wherein the second passive electrode of the first transistor is coupled to ground; a first resistive element that is coupled to the second terminal; a first diode stack that is coupled to the first resistive element, wherein the first diode stack has a first breakdown voltage; a second diode stack that is coupled between the first diode stack and the control electrode of the first transistor, wherein the second diode stack has a second breakdown voltage; a second resistive element that is coupled between the first terminal and a node between the first and second diode stacks; and a second transistor having a first passive electrode, a second passive electrode, and a control electrode, wherein the first passive electrode of the second transistor is coupled to the node between the first and second diode stacks, and wherein the control electrode of the second transistor is coupled to the first terminal, and wherein the second passive electrode of the second transistor is coupled to the control electrode of the first transistor.

In accordance with a preferred embodiment of the present invention, an apparatus is provided. The apparatus comprises a first terminal; a second terminal; an NMOS transistor that is coupled to the second terminal at its drain and that is coupled to ground at its source; a first resistor that is coupled to the second terminal; a first stack of zener diodes that is coupled to the first resistor, wherein the first diode stack has a first breakdown voltage; a second stack of zener diodes that is coupled between the first stack and the gate of the NMOS transistor, wherein the second stack has a second breakdown voltage; a second resistor that is coupled between the first terminal and a node between the first and second stacks; and a PMOS transistor that is coupled to the node between the first and second stacks at its source, that is coupled to the second terminal at its gate, and that is coupled to the gate of the NMOS transistor at its drain.

In accordance with a preferred embodiment of the present invention, the first breakdown voltage is about 20V.

In accordance with a preferred embodiment of the present invention, the second breakdown voltage is about 25V.

In accordance with a preferred embodiment of the present invention, the apparatus further comprises a reverse biased diode that is coupled between the second resistive element and the first terminal.

In accordance with a preferred embodiment of the present invention, the apparatus further comprises a forward biased diode that is coupled substantially in parallel to the second resistive element.

In accordance with a preferred embodiment of the present invention, the apparatus further comprises: a buffer; and a third resistor that is coupled between the buffer and the gate of the NMOS transistor.

In accordance with a preferred embodiment of the present invention, the first resistor is about 6 kΩ.

In accordance with a preferred embodiment of the present invention, the second resistor is about 200 kΩ.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
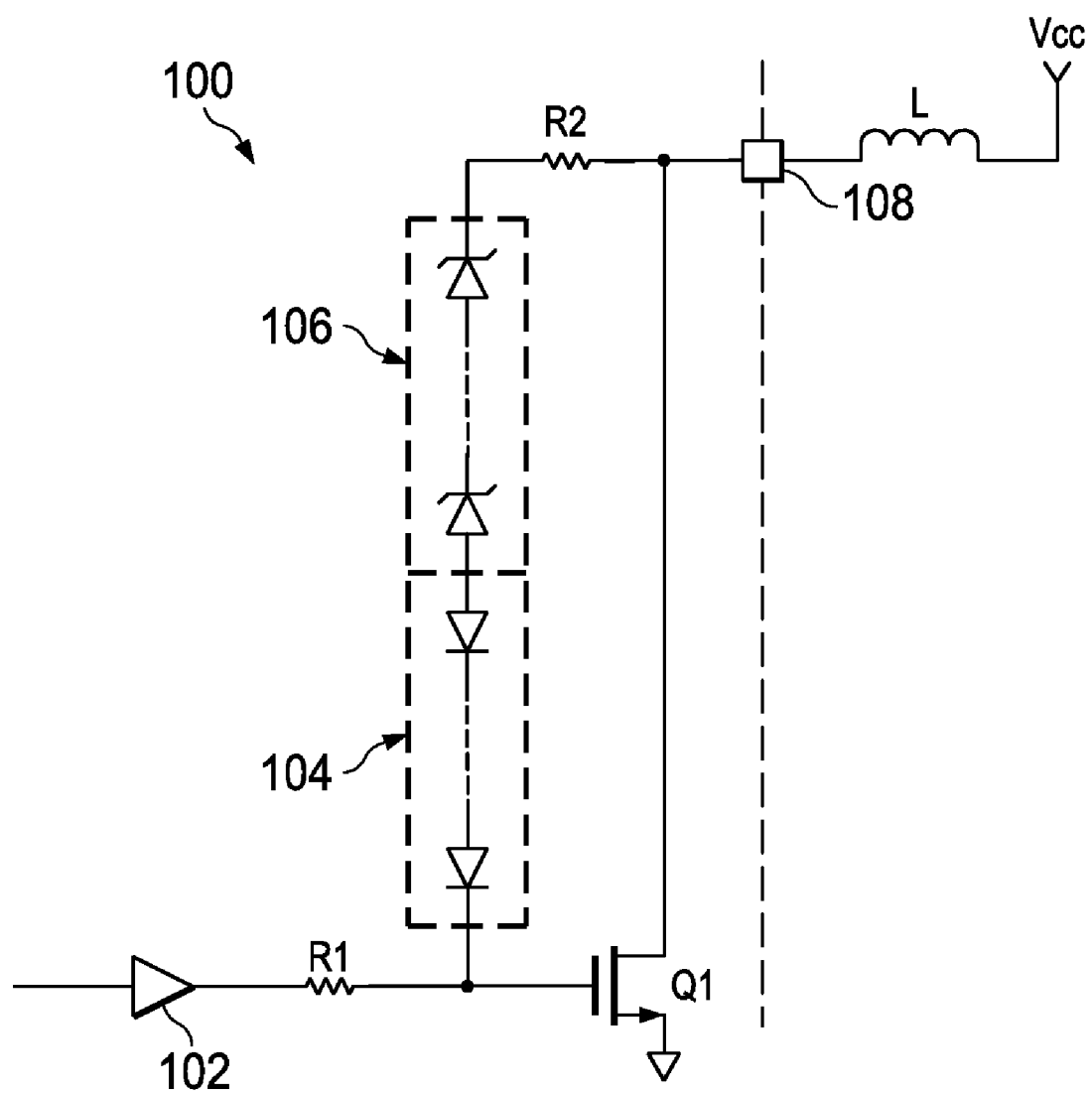
FIG. 1 is a conventional integrated circuit (IC) having clamping circuit.

Refer now to the drawings wherein depicted elements are, for the sake of clarity, not necessarily shown to scale and wherein like or similar elements are designated by the same reference numeral through the several views.

Figure 2:
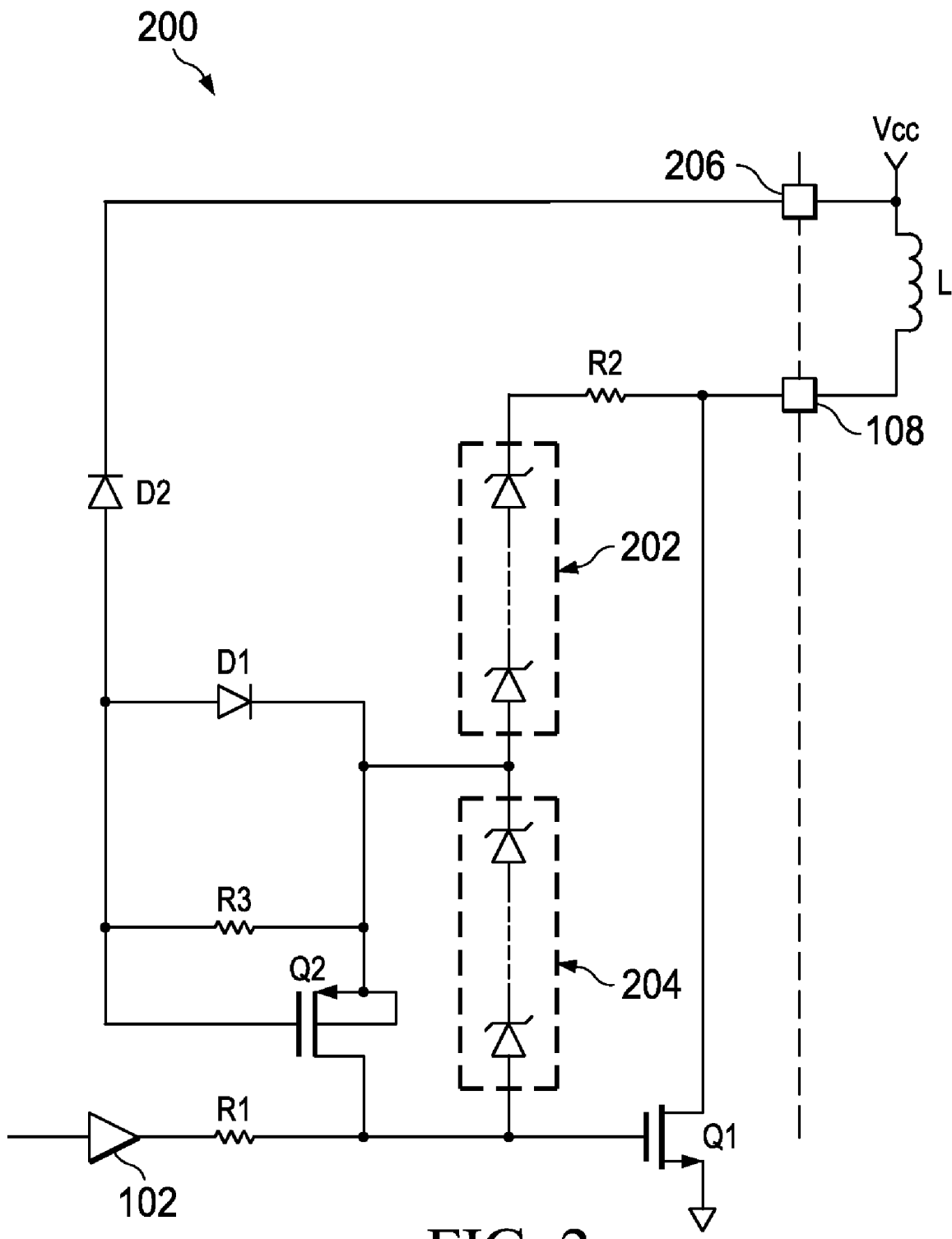
FIG. 2 is an example of an IC having clamping circuit in accordance with a preferred embodiment of the present invention.

Referring to FIG. 2 of the drawing, reference numeral 200 generally designates an example of an integrated circuit (IC) in accordance with a preferred embodiment of the present invention. IC 200 generally comprises terminals or pins 206 and 108. Preferably, inductor L is coupled across the terminals 206 and 108, and a voltage supply VCC is coupled to terminal 206. As with IC 100, the inductor L is energized when an actuation signal is provided through buffer 102 and resistor R1 to the gate or control electrode of transistor Q1 (which, again, is generally an NMOS transistor).

A difference, however, between IC 100 and IC 200 is that the clamp employed in IC 200 is an adaptive clamp. When transistor Q1 is deactuated, reverse biased diode D2 forces the fly-back current through terminal 108 to resistor R2 (which has a resistance of about 6 kΩ). Preferably, two separate diode stacks 202 and 204 (which each include a string of series coupled, reverse bias zener diodes so as to provide two separate breakdown voltages) are coupled in series between resistor R2 and the gate of transistor Q1. The breakdown voltages for stacks 202 and 204 may be, for example, about 20V and about 25V, respectively. If the voltage of the fly-back current (after the voltage drop across resistor R2) is greater than the combined break down voltages of stacks 202 and 204, the fly-back current flows through the stacks 202 and 204 to transistor Q1. Once the voltage of the fly-back current (after the voltage drop across resistor R2) is greater than a threshold voltage (related to the resistance of resistor R3) and less than the combined breakdown voltage of stacks 202 and 204, the fly-back current flows from the node between stacks 202 and 204 through resistor R3 (which preferably has a resistance of about 200 kΩ), actuating transistor Q2 (which is preferably a PMOS transistor). This allows for a second current path to form between terminal 108 and the gate of transistor Q1 until the voltage of the fly-back current (after the voltage drop across resistor R2) is below the combined breakdown voltage of stack 202 and voltage drop across resistor R3 or threshold voltage. Additionally, forward biased diode D1 is generally provided in parallel to resistor R3 as an additional protection diode.

When comparing a conventional circuit, such as IC 100, to IC 200, there are several advantages. For example transistor Q1 in IC 100 is about 489,000 μm$^2$, and transistor Q1 in IC 100 is, roughly, 25% larger than its minimum specifications to meet an on-resistance of 0.5Ω so as to meet the fly-back energy handling capability at a clamping voltage that is larger than supply transients. If one were to assume for IC 100 that a 3.5 A traverses inductor L (having an inductance of 10 mH and a resistance of 4Ω at room temperature) and a generally constant clamp voltage of 45V, the peak temperature during fly-back would be about 270 C. In comparison to IC 200, with an adaptive clamp voltage of 20V above the supply VCC (normally at 14V), the peak temperature would be about 224 C. This reduction of peak temperature would allow one to decrease the size of transistor Q1 in IC 200 to about 395,500 μm$^2$, which is a reduction in area of 20%. This reduction in area allows one to build a more compact IC, reducing costs and improving performance. Additionally, IC 200 allows the clamping voltage to be much lower during normal operation where the supply voltage VCC is at moderate levels while still having a higher clamping voltage during the supply spike events by dynamically adjusting the clamping voltage proportional to the supply voltage level.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
 a first terminal;
 a second terminal;
 a first transistor having a first passive electrode, a second passive electrode, and a control electrode, wherein the first passive electrode of the first transistor is coupled to the second terminal;
 a first resistive element that is coupled to the second terminal;
 a first diode stack that is coupled to the first resistive element, wherein the first diode stack has a first breakdown voltage;
 a second diode stack that is coupled between the first diode stack and the control electrode of the first transistor, wherein the second diode stack has a second breakdown voltage;
 a second resistive element that is coupled between the first terminal and a node between the first and second diode stacks; and
 a second transistor having a first passive electrode, a second passive electrode, and a control electrode, wherein the first passive electrode of the second transistor is coupled to the node between the first and second diode stacks, and wherein the control electrode of the second transistor is coupled to the first terminal, and wherein the second passive electrode of the second transistor is coupled to the control electrode of the first transistor.

2. The apparatus of claim 1, wherein the first and second diode stacks further comprise a first and a second set of zener diodes, respectively.

3. The apparatus of claim 1, wherein the apparatus further comprises a diode that is coupled between the second resistive element and the first terminal.

4. The apparatus of claim 1, wherein the apparatus further comprises a diode that is coupled substantially in parallel to the second resistive element.

5. The apparatus of claim 1, wherein the apparatus further comprises:
 a buffer; and
 a third resistive element that is coupled between the buffer and the control electrode of the first transistor.

6. The apparatus of claim 1, wherein the first and second resistive elements further comprise a first resistor and a second resistor, respectively.

7. An apparatus comprising:
 a voltage supply;
 an inductor that is coupled to the voltage supply; and
 an integrated circuit (IC) having:
  a first terminal that is coupled to the inductor and the voltage supply;
  a second terminal that is coupled to the inductor;
  a first transistor having a first passive electrode, a second passive electrode, and a control electrode, wherein the first passive electrode of the first transistor is coupled to the second terminal, and wherein the second passive electrode of the first transistor is coupled to ground;
  a first resistive element that is coupled to the second terminal;
  a first diode stack that is coupled to the first resistive element, wherein the first diode stack has a first breakdown voltage;
  a second diode stack that is coupled between the first diode stack and the control electrode of the first transistor, wherein the second diode stack has a second breakdown voltage;
  a second resistive element that is coupled between the first terminal and a node between the first and second diode stacks; and
  a second transistor having a first passive electrode, a second passive electrode, and a control electrode, wherein the first passive electrode of the second transistor is coupled to the node between the first and second diode stacks, and wherein the control electrode of the second transistor is coupled to the first terminal, and wherein the second passive electrode of the second transistor is coupled to the control electrode of the first transistor.

8. The apparatus of claim 7, wherein the first and second diode stacks further comprise a first and a second set of zener diodes, respectively.

9. The apparatus of claim 7, wherein the apparatus further comprises a diode that is coupled between the second resistive element and the first terminal.

10. The apparatus of claim 7, wherein the apparatus further comprises a diode that is coupled substantially in parallel to the second resistive element.

11. The apparatus of claim 7, wherein the apparatus further comprises:
 a buffer; and
 a third resistive element that is coupled between the buffer and the control electrode of the first transistor.

12. The apparatus of claim 7, wherein the first and second resistive elements further comprise a first resistor and a second resistor, respectively.

13. An apparatus comprising:
 a first terminal;
 a second terminal;
 an NMOS transistor that is coupled to the second terminal at its drain and that is coupled to ground at its source;
 a first resistor that is coupled to the second terminal;
 a first stack of zener diodes that is coupled to the first resistor, wherein the first diode stack has a first breakdown voltage;
 a second stack of zener diodes that is coupled between the first stack and the gate of the NMOS transistor, wherein the second stack has a second breakdown voltage;
 a second resistor that is coupled between the first terminal and a node between the first and second stacks; and
 a PMOS transistor that is coupled to the node between the first and second stacks at its source, that is coupled to the second terminal at its gate, and that is coupled to the gate of the NMOS transistor at its drain.

14. The apparatus of claim 13, wherein the first breakdown voltage is about 20V.

15. The apparatus of claim 13, where the second breakdown voltage is about 25V.

16. The apparatus of claim 13, wherein the apparatus further comprises a reverse biased diode that is coupled between the second resistive element and the first terminal.

17. The apparatus of claim 16, wherein the apparatus further comprises a forward biased diode that is coupled substantially in parallel to the second resistive element.

18. The apparatus of claim 13, wherein the apparatus further comprises:

a buffer; and
a third resistor that is coupled between the buffer and the gate of the NMOS transistor.

19. The apparatus of claim 13, wherein the first resistor is about 6 kΩ.

20. The apparatus of claim 13, wherein the second resistor is about 200 kΩ.

* * * * *